United States Patent [19]

Kaminsky et al.

[11] Patent Number: 4,574,660

[45] Date of Patent: Mar. 11, 1986

[54] COMPONENT ASSEMBLY TABLE DRIVE

[75] Inventors: Naum M. Kaminsky; Robert J. Sooy, both of Marblehead, Mass.

[73] Assignee: USM Corporation, Farmington, Conn.

[21] Appl. No.: 581,970

[22] Filed: Feb. 21, 1984

[51] Int. Cl.⁴ .......................................... B23Q 17/00
[52] U.S. Cl. .................................... 74/822; 74/813 L
[58] Field of Search ................ 74/822, 813 C, 813 L, 74/817, 813 R, 194; 292/5, 201, 144

[56] References Cited

U.S. PATENT DOCUMENTS

| 2,884,795 | 5/1979 | Coven | 74/194 X |
|---|---|---|---|
| 3,048,059 | 8/1962 | Cross | 74/822 X |
| 3,686,979 | 8/1972 | Petri, Jr. et al. | 74/813 C |
| 3,706,363 | 12/1972 | Niles | 74/194 X |
| 3,913,417 | 10/1975 | Vangor | 74/822 |
| 3,955,840 | 5/1976 | Rawls et al. | 292/201 X |
| 3,972,100 | 8/1976 | Zemek et al. | 29/739 X |
| 4,050,355 | 9/1977 | Niskanen | 74/817 X |
| 4,080,730 | 3/1978 | Woodman | 29/701 |

FOREIGN PATENT DOCUMENTS

| 1179077 | 10/1984 | Fed. Rep. of Germany | 74/813 |
|---|---|---|---|
| 1362973 | 8/1974 | United Kingdom | 74/813 C |

Primary Examiner—Kenneth J. Dorner
Assistant Examiner—Rodney M. Lindsey
Attorney, Agent, or Firm—Alan N. McCartney

[57] ABSTRACT

A drive mechanism for the assembly table of an electrical component insertion machine having a motor driven roller engaging the peripheral edge of a disc on the table. A latch mechanism is located on the table for engaging a latch block on the table disc, the latch mechanism being releasable in response to a program control to permit the table disc to rotate and at the same time energize the motor driven roller to rotate the table disc. The disc can be rotated in either direction.

3 Claims, 5 Drawing Figures

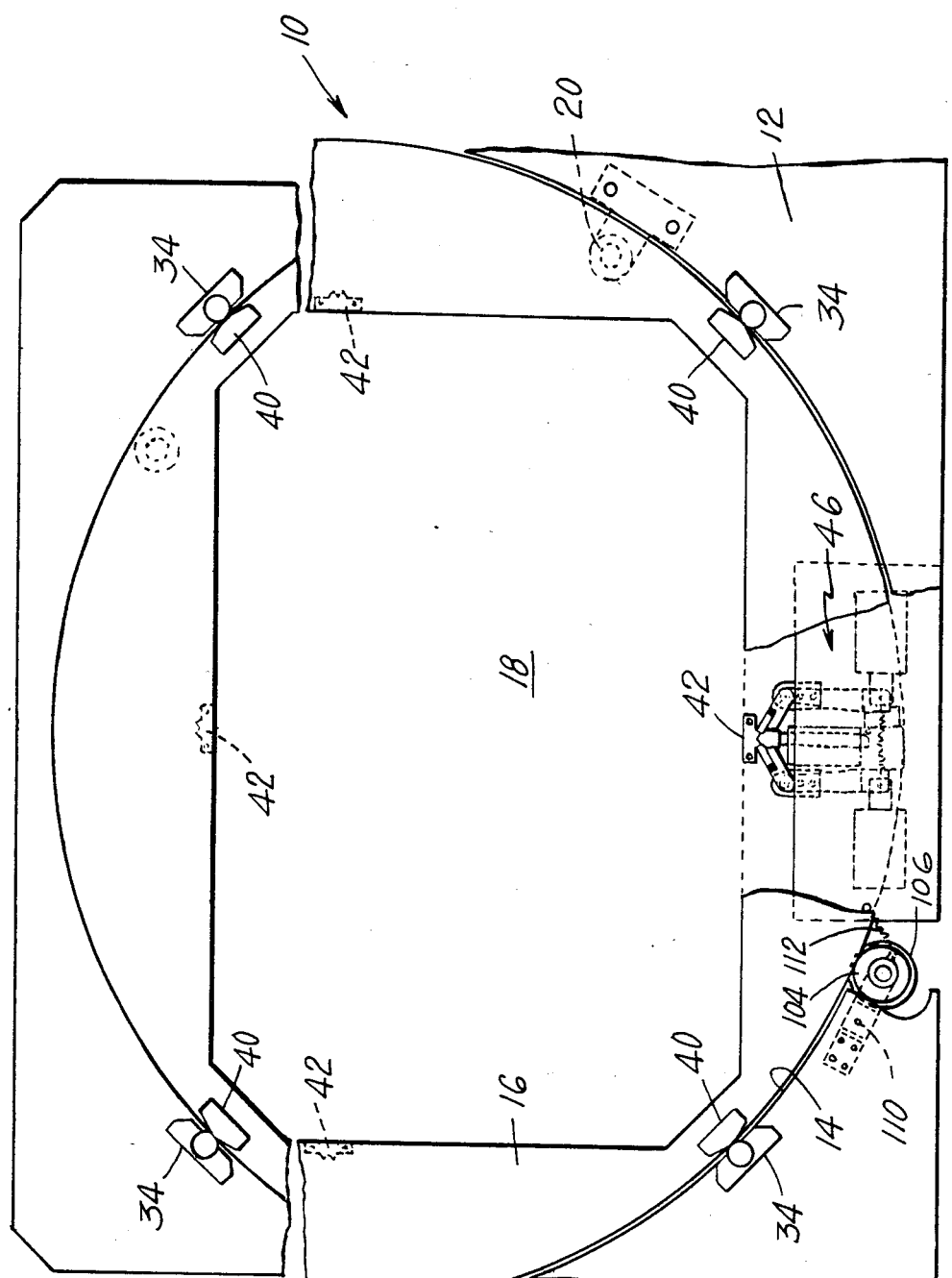

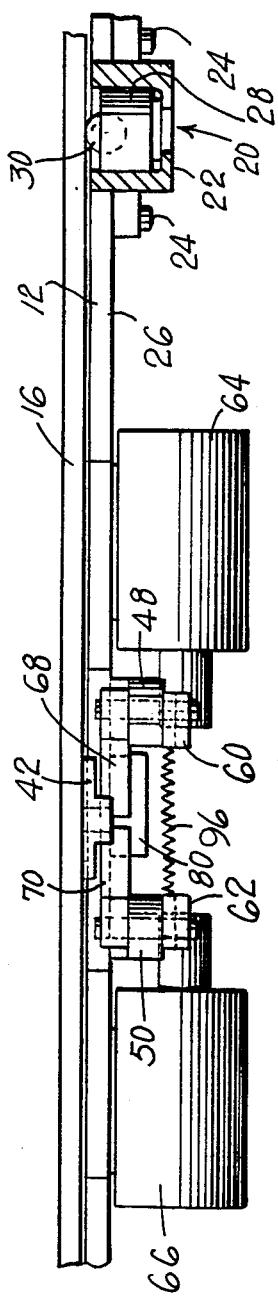
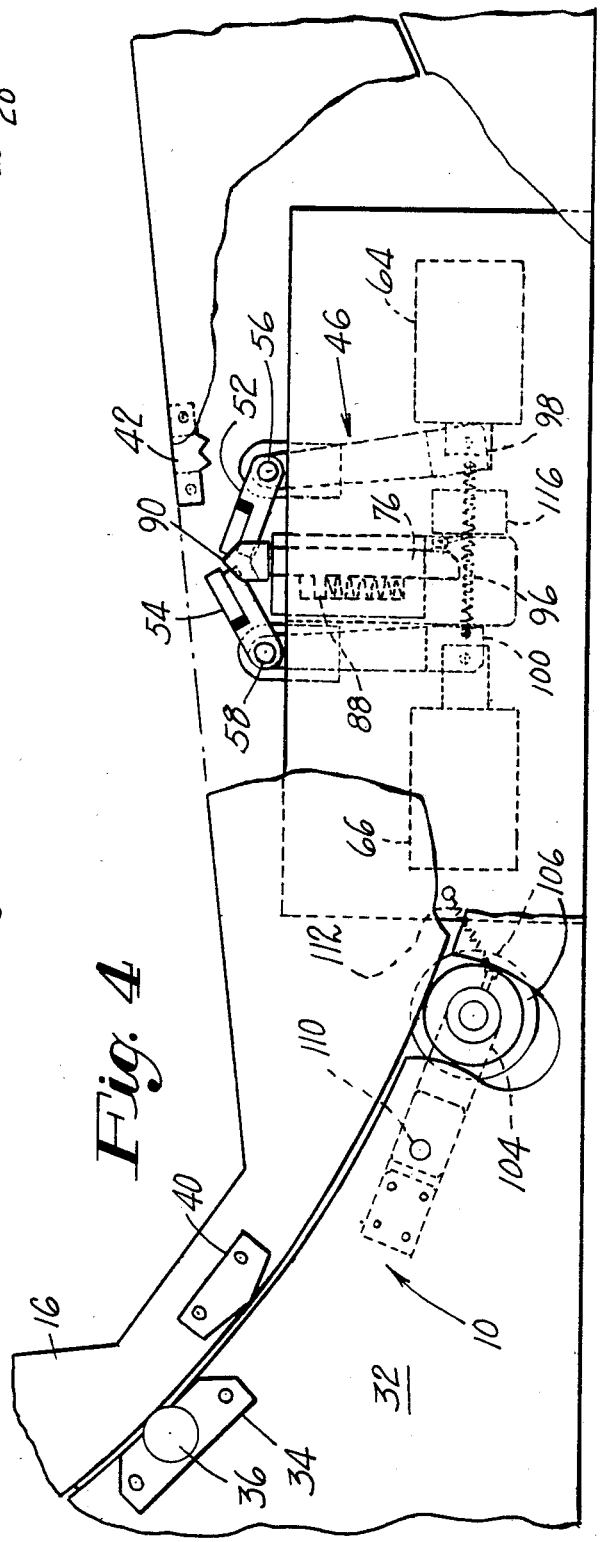

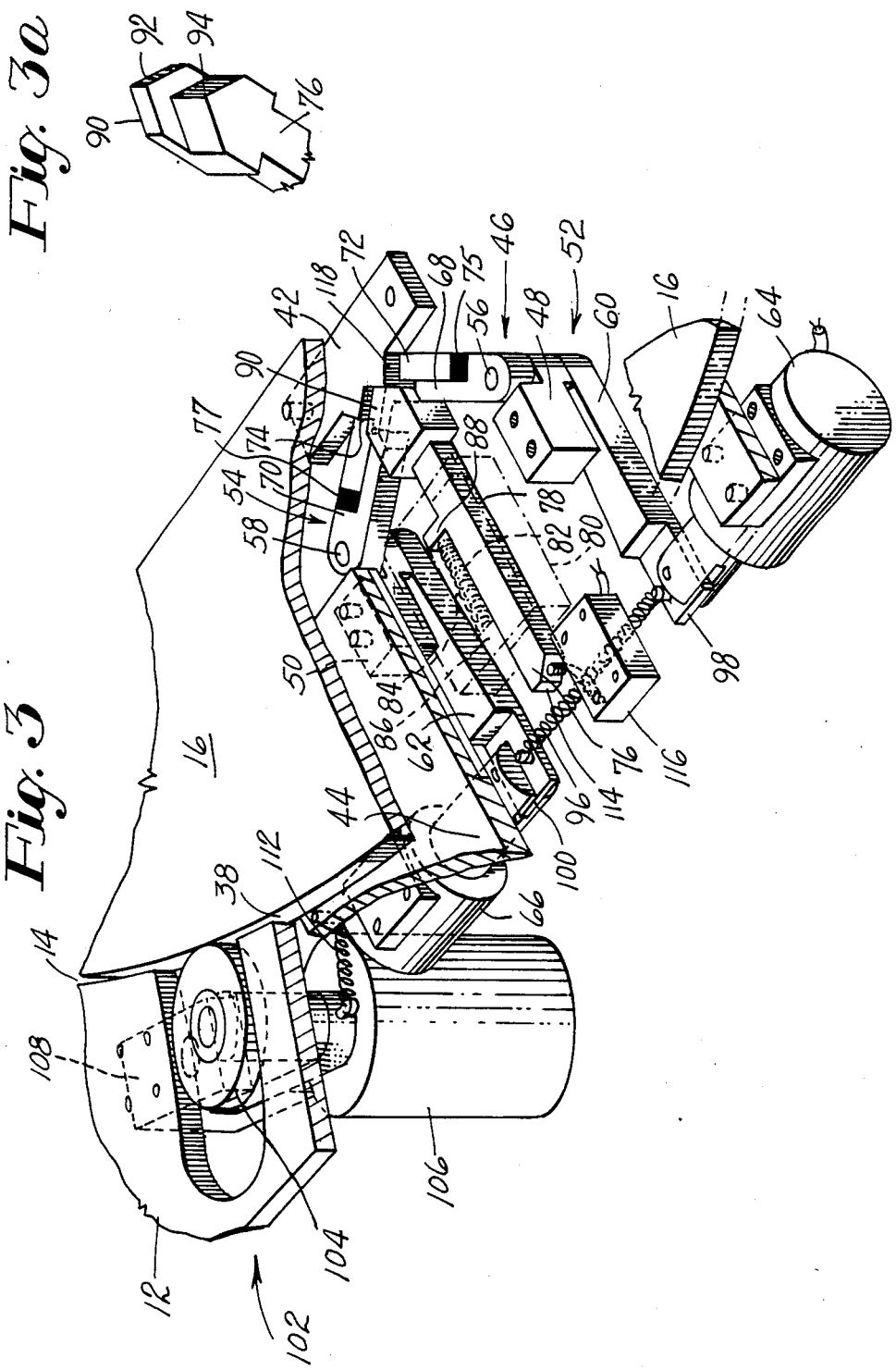

COMPONENT ASSEMBLY TABLE DRIVE

BACKGROUND OF THE INVENTION (1) Field of the Invention

This invention relates to a drive mechanism for an electrical component assembly table.

(2) Summary of the Prior Art

In machines for automatically assembling electrical components to a printed circuit board, the components are received from a storage means by a placement head which inserts the component leads down through the desired openings in the board. The board is held on a movable table which is positioned beneath the placement head.

The table is driven through an X-Y motion in response to a programmed control to properly locate the openings in the board beneath the placement head insertion mechanism to position the component leads in the openings of the board. During this operation, the table disc is also rotated in 90° increments to align the component leads with the openings in the board. U.S. Pat. Nos. 3,972,100 and 4,080,730 illustrate machines of this type. The machines of the type illustrated by these patents do not have the table disc controlled by a latching mechanism which also controls the drive to the table disc.

SUMMARY OF THE INVENTION

It is a feature of this invention to provide a drive mechanism for a rotary table used in an electrical component assembly machine which has a placement head that positions the component on a printed circuit board held on the table.

It is a further object of this invention to provide a latching mechanism for a rotary assembly table which automatically stops and locks the table in predetermined desired incremental degrees of rotational movement. Further, upon release of such latching mechanism, the drive to the table is automatically energized to rotate the table to reposition the boards for the next component insertion sequence. This entire operation is accomplished in response to a programmed control.

It is also an object of this invention to provide a drive mechanism for a rotary assembly table which has a driven roller in contact with the peripheral edge of the driven disc of the table. The table has a plate supporting the disc with the plate carrying a latching mechanism that coacts with the disc to look the disc in a stationary position. The latch mechanism comprises a pair of linkages controlling the position of a plunger that is adapted to engage a block on the disc to lock the disc in 90° positions.

BRIEF DESCRIPTION OF THE DRAWINGS

FIG. 1 is a top plan view of the assembly table illustrating the table drive and table locking mechanism;

FIG. 2 is a side elevational view of the locking mechanism;

FIG. 3 is a perspective view of the locking mechanism; and

FIG. 3 (a) is a perspective view illustrating the tapered end surfaces of the plunger of the latching mechanism.

FIG. 4 is a plan view of the table with the locking mechanism in released condition to enable the table disc to be rotated.

DESCRIPTION OF THE PREFERRED EMBODIMENT

The assembly table 10 is adapted to be mounted on a support for movement on a X-Y axis beneath the placement head of a component insertion machine. The table 10 supports a blank (not shown) upon which a plurality of printed circuit boards may be secured. The table is driven through the X-Y motion to sequentially position the boards beneath the placement head. Thereafter, the table is rotated to axially reposition the boards with respect to the placement head so that the next component in sequence can be assembled on the boards. This general operation is described in detail in commonly owned U.S. Pat. No. 4,080,730 and the disclosure therein is incorporated herein by reference.

The table 10 comprises a plate 12 having a circular opening 14 in which disc 16 is rotatably mounted. The disc 16 is adapted to carry a blank (not shown) upon which the printed circuit boards are held. The disc 16 has an opening 18 through which the inserted component leads extend (beneath the board) so that the component leads can be cut and clinched to secure the component to the board, as is well known in this art.

The disc 16 can be rotatably supported in the opening 14 of plate 12 by any suitable means such as the rollers illustrated in U.S. Pat. No. 4,080,730 or by ball transfer units 20 as illustrated in FIG. 2. The ball transfer units 20 comprise brackets 22 secured by bolts 24 to the underside 26 of the plate 12. The brackets 22 each contain a bearing block 28 housing a bearing 30 upon which the disc 16 is mounted for free rotational movement in the opening 14 of the plate 12.

Mounted on the upper surface 32 of the plate 12 are thrust bearings 34 which have rollers 36 acting against the peripheral edge 38 of the disc 16 to maintain the disc in the center of the opening 14 in plate 12. The thrust bearings 34 are located at 90° increments around the disc 16. Locating plates 40 are positioned around the edge of the disc 16 and are adapted to be located adjacent the thrust bearings 34 during set-up of the assembly table.

The disc 16 is latchable to the plate 12 at 90° increments to align any printed circuit boards thereon boards with the placement head of the assembly machine as previously mentioned. For this purpose, V-notched blocks 42 are equally spaced around the inner edge of the opening 18 of the disc 16. A mounting plate 44, as shown in FIG. 3 is secured to the underside 26 of plate 12 and carries a locking mechanism 46 which coacts with the blocks 42 to lock the disc 16 at the 90° positions.

Secured to the mounting plate 44 are right and left-hand mounting blocks 48, 50 (shown in FIG. 3) which pivotally carry linkages 52, 54 on pivot pins 56, 58. Each of the linkages 52, 54 comprises a rearward arm member 60, 62 attached to solenoids 64, 66, respectively, carried on the mounting plate 44. The forward arm 68, 70 of the linkages 52, 54 have a latching end portion 72, 74 which are slideably mounted on the arms 68, 70. Bumpers 75, 77 are located on arms 68, 70 to absorb the shock of the movement of end portions 72, 74 as will become apparent hereafter. A plunger 76 is slidably carried in an opening 78 in a block 80 secured to the mounting plate 44. A compression spring 82 is carried in the opening 84 in block 80 and acts against the wall 86 of opening 84 and the arm 88 on plunger 76 to bias the plunger 76 outwardly toward the disc. The enlarged free end 90 of the plunger 76 has a dual tapered end 92, 94, shown in FIG. 3A, one of which latches into the V-notched block 42 and the other coacts with the ends 72, 74 of the arms 68, 70. A tension spring 96 is attached between the ends 98, 100 of the arms 60, 62 to normally pivot the linkages 52, 54 in a direction to permit the plunger 76 to engage each V-notched block 42, as will become apparent hereafter.

The table drive mechanism 102 comprises a roller 104 driven by a motor 106 as shown in FIGS. 3 and 4. The roller 104 and motor 106 are carried on a plate 108 pivotally mounted at 110 to the plate 12. A tension spring 112 positioned between the motor 106 and the plate 12 normally biases the roller 104 into engagement with the peripheral edge 38 of the disc 16.

In operation, when it is necessary in the component assembly sequence to rotate the table, the right or left solenoid 64, 66 will be energized, depending upon the direction of rotation of the disc desired. For example, if the disc is to be rotated counterclockwise, solenoid 64 will be energized (See FIG. 4). This will pivot the linkage 52 on its pivot pin 56 causing the latch end 72 to act against tapered end 94 forcing the plunger 76 inwardly releasing the tapered end 92 of the plunger 76 from the V-notched block 42. At this time, the free end 114 of the plunger 76 contacts a limit switch 116 which will energize the motor 106 and drive the roller 104 to rotate the disc 16. Thereafter, the solenoid 64 would be de-energized. As the disc 16 rotates, the next V-notched block will abut the end 74 of arm 70 and pivot the arm out of the way. This will force plunger 76 inwardly to again activate the limit switch 116 to turn off the motor 106 and thus the drive to the table. At this time, the end 72 of arm 68 will abut the shoulder 118 of the V-notch block 42 to stop the disc 16 from rotating. At this time, bumper 75 absorbs the shock of the contact with the block 42. Further, as the V-notch block 42 passes the end 74 of arm 70, the spring 96 will pivot the arm 70 to release the plunger 76 so that the tapered end 92 can again engage the V-notched block 42 to lock the disc 16 in a stationary position.

When it is desired to rotate the disc 16 in a clockwise direction, the solenoid 66 is energized pulling the plunger 76 out of block 42 (at the time solenoid 66 is energized, the program control will reverse the motor 106). The plunger 76 will again activate limit switch 116 to energize motor 106 to drive the table. When the next block 42 arrives at the latch mechanism 46, the arm 60 will be cammed out of the way, forcing plunger 76 inwardly to activate the limit switch and turn off motor 106. Thereafter, the plunger 76 is released to lock into the V-notched block 42 in the same manner as previously described.

It can thus be seen that a table drive mechanism and latching mechanism locking the table in preselected positions has been provided wherein the latch mechanism upon being released will permit the table to be automatically driven. Further, the table drive is de-energized when the table is arrested by the latch mechanism. It should also be recognized that by relocating the blocks 42, any predesired degree of rotation of the disc 16 can be accomplished.

We claim:

1. A table adapted to support printed circuit boards for assembly of electrical components to the board, comprising:
   a. a support plate having a circular opening;
   b. a disc rotatably supported in said plate opening;
   c. a drive mechanism for rotationally driving said disc;
   d. a latch mechanism responsive to a control means for locking said disc against rotation and releasing said disc for free rotational movement;
   e. release means on said latch mechanism to cause actuation of said drive mechanism to rotate said table disc,
   f. said latch mechanism being carried on said plate and includes a plunger positioned into and out of engagement with a block carried on said disc,
   g. said latch mechanism having a pair of linkages positioned by solenoids to position said plunger,
   h. said linkages including latch portions positionable against said block to stop the rotation of said disc, and
   i. said linkages having surfaces coacting with said plunger to retract said plunger from said block.

2. The table of claim 1 in which said plunger when positioned out of engagement with said block operates a switch permitting operation of said drive mechanism.

3. The table of claim 1 in which said drive mechanism is a motor driven roller in frictional engagement with the peripheral edge of said disc.

* * * * *